United States Patent
Wen et al.

(10) Patent No.: US 8,508,951 B2
(45) Date of Patent: Aug. 13, 2013

(54) PRINTED CIRCUIT BOARD FOR USE IN GIGABIT-CAPABLE PASSIVE OPTICAL NETWORK AND METHOD FOR LAYING OUT THE PRINTED CIRCUIT BOARD

(75) Inventors: Hsiang-Sheng Wen, Pingzhen (TW); Ching-Feng Hsieh, Taipei (TW)

(73) Assignee: Askey Computer Corp. (TW)

( * ) Notice: Subject to any disclaimer, the term of this patent is extended or adjusted under 35 U.S.C. 154(b) by 388 days.

(21) Appl. No.: 12/984,691

(22) Filed: Jan. 5, 2011

(65) Prior Publication Data

US 2012/0147568 A1    Jun. 14, 2012

(30) Foreign Application Priority Data

Dec. 10, 2010  (TW) ................................ 99143258 A

(51) Int. Cl.
*H05K 1/18* (2006.01)
(52) U.S. Cl.
USPC ........... 361/764; 361/760; 361/763; 361/784; 361/803
(58) Field of Classification Search
USPC .......................... 361/760–764, 803, 782–784
See application file for complete search history.

(56) References Cited

U.S. PATENT DOCUMENTS

| 2003/0156086 | A1* | 8/2003 | Maeda et al. | 345/89 |
|---|---|---|---|---|
| 2005/0168602 | A1* | 8/2005 | Sumi et al. | 348/294 |
| 2006/0064186 | A1* | 3/2006 | Ryle et al. | 700/94 |
| 2006/0279267 | A1* | 12/2006 | Burton et al. | 323/282 |

* cited by examiner

*Primary Examiner* — Tuan T Dinh
(74) *Attorney, Agent, or Firm* — Schmeiser, Olsen & Watts, LLP

(57) ABSTRACT

A method for laying out a printed circuit board for use in a gigabit-capable passive optical network includes the steps of providing a printed circuit board and laying out an analog circuit module, an analog-to-digital conversion module, a signal processing module, an optoelectronic transmitting and receiving module, and a power module on the printed circuit board. The printed circuit board has a first periphery and an opposing second periphery. The analog circuit module and the optoelectronic transmitting and receiving module are laid out at the first periphery of the printed circuit board. The power module is laid out at the second periphery of the printed circuit board. Electromagnetic wave generated by a power IC inserted in the power module does not interfere with data transmission taking place at the optoelectronic transmitting and receiving module. Furthermore, a printed circuit board for use with the method is proposed.

10 Claims, 2 Drawing Sheets

PRINTED CIRCUIT BOARD FOR USE IN GIGABIT-CAPABLE PASSIVE OPTICAL NETWORK AND METHOD FOR LAYING OUT THE PRINTED CIRCUIT BOARD

CROSS-REFERENCE TO RELATED APPLICATION

This non-provisional application claims priority under 35 U.S.C. §119(a) on Patent Application No(s). 099143258 filed in Taiwan, R.O.C. on Dec. 10, 2010, the entire contents of which are hereby incorporated by reference.

FIELD OF THE TECHNOLOGY

The present invention relates to printed circuit boards for use in a gigabit-capable passive optical network and methods for laying out the printed circuit boards, and more particularly, to a printed circuit board capable of reducing radio frequency signal interference caused by power supply switching frequency and a method for laying out the printed circuit board.

BACKGROUND

Due to the ubiquity of the Internet and user demand for bandwidth, the telecommunication industry develops the Very-High-Speed Digital Subscriber Lines (VDSL) which, compared to the conventional Asymmetric Digital Subscriber Line (ADSL), is sophisticated and has high upstream and downstream band speeds. However, despite a boost in the transmission speed of VDSL, there are stricter requirements for the circuit layout of an electronic apparatus for use in VDSL than ADSL.

The circuit layout of a printed circuit board that carries electronic chips for use in a gigabit-capable passive optical network has to be optimized in order for the printed circuit board to manifest high transmission efficiency and performance. Furthermore, optimization of the circuit layout of the printed circuit board is not only effective in reducing electromagnetic interference (EMI) between internal electronic components, but is crucial for miniaturization and standardization.

Accordingly, it is imperative to solve the aforesaid problems by providing a printed circuit board for use in a gigabit-capable passive optical network and a method for laying out the printed circuit board.

SUMMARY

It is an objective of the present invention to provide a method for laying out a printed circuit board for use in a gigabit-capable passive optical network such that, due to the circuit layout on the printed circuit board, not only can a multi-port chip which is dedicated to communication and transmission be mounted on the printed circuit board, but electromagnetic interference (EMI) between the modules of the printed circuit board can be reduced.

Another objective of the present invention is to provide a printed circuit board for use in a gigabit-capable passive optical network, wherein the aforesaid circuit layout is applicable to the printed circuit board.

In order to achieve the above and other objectives, the present invention provides a method for laying out a printed circuit board for use in a gigabit-capable passive optical network, comprising the steps of: providing a printed circuit board having a first periphery and an opposing second periphery; laying out an analog circuit module at the first periphery of the printed circuit board so as for a plurality of analog signals to be transmitted between the printed circuit board and an external circuit; laying out an analog-to-digital conversion module on the printed circuit board in a manner that the analog-to-digital conversion module is disposed in vicinity of the analog circuit module for converting the analog signals into a plurality of digital signals and vice versa, respectively; laying out a signal processing module on the printed circuit board in a manner that the signal processing module is disposed in vicinity of the analog-to-digital conversion module so as to process the digital signals; laying out an optoelectronic transmitting and receiving module at the first periphery of the printed circuit board for performing optoelectronic modulation transfer on the digital signals and, upon completion of the optoelectronic modulation transfer, transmitting and receiving the digital signals in optical or electrical form; and laying out a power module at the second periphery of the printed circuit board for supplying power to the modules on the printed circuit board.

In order to achieve the above and other objectives, the present invention provides a printed circuit board for use in a gigabit-capable passive optical network. The printed circuit board has a first periphery and an opposing second periphery. The printed circuit board comprises an analog circuit module, an analog-to-digital conversion module, a signal processing module, an optoelectronic transmitting and receiving module, and a power module. The analog circuit module is disposed at the first periphery so as for a plurality of analog signals to be transmitted between the printed circuit board and an external circuit. The analog-to-digital conversion module disposed near and connected to the analog circuit module for converting the analog signals into a plurality of digital signal and vice versa, respectively. The signal processing module is disposed near and connected to the analog-to-digital conversion module for processing the digital signals. The optoelectronic transmitting and receiving module is connected to the signal processing module and disposed at the first periphery. The power module is connected to the analog circuit module, the analog-to-digital conversion module, the signal processing module, and the optoelectronic transmitting and receiving module, and is disposed at the second periphery.

The present invention provides a method for laying out a printed circuit board for use in a gigabit-capable passive optical network. Compared to the prior art, the present invention not only implements a multi-port chip dedicated to communication and transmission, using a simpler circuit layout, but protects a radio frequency connecting unit disposed on the printed circuit board against electromagnetic interference (EMI) from the power module and thus provides a high-quality output signal. The present invention further provides a printed circuit board for use with the method.

BRIEF DESCRIPTION OF THE DRAWINGS

To enable persons skilled in the art to fully understand the objectives, features, and advantages of the present invention, the present invention is hereunder illustrated with specific embodiments in conjunction with the accompanying drawings, in which.

DETAILED DESCRIPTION

Figure 1:
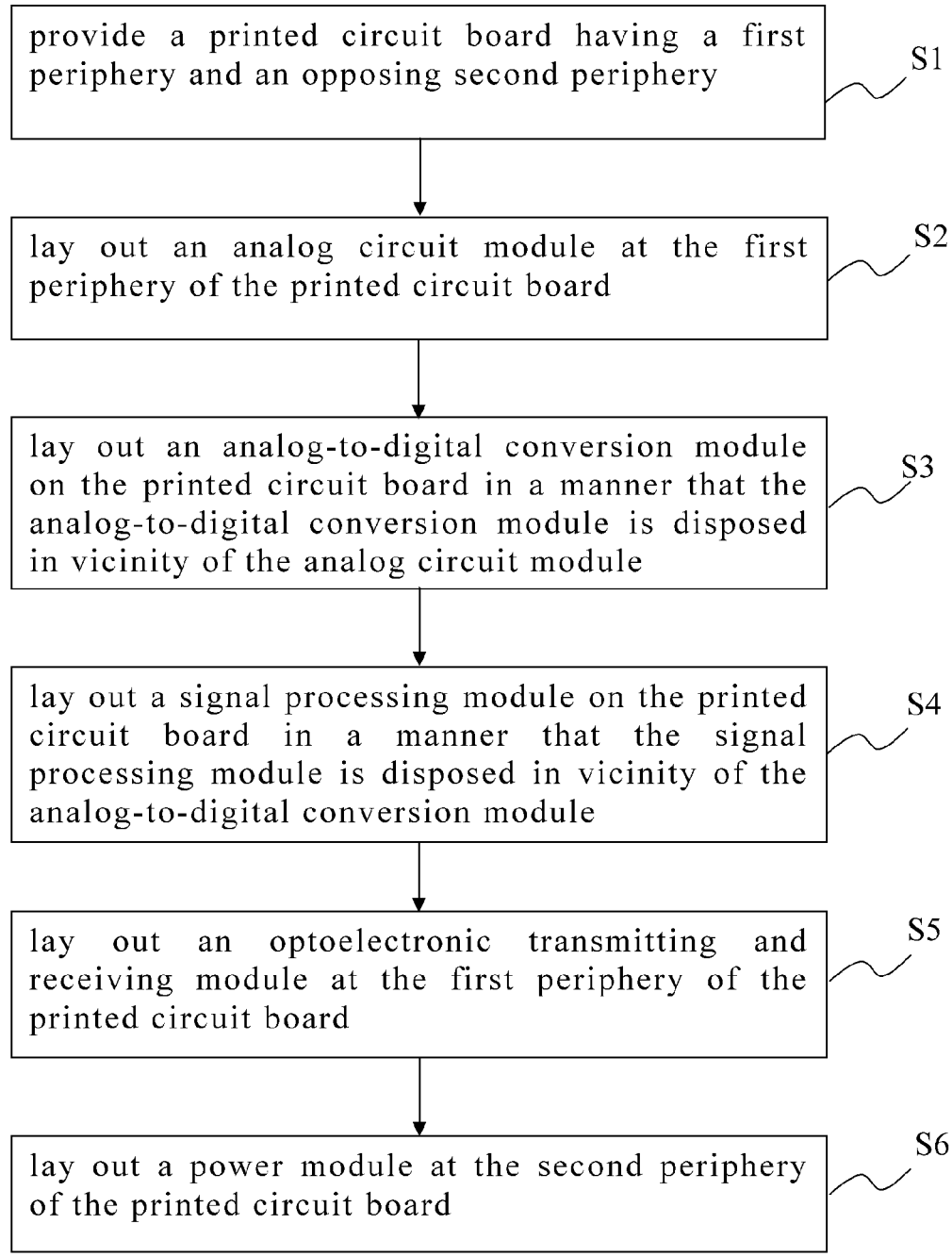
FIG. 1 is a schematic view of a method for laying out a printed circuit board for use in a gigabit-capable passive optical network according to an embodiment of the present invention.

Referring to FIG. 1, there is shown a schematic view of a method for laying out a printed circuit board for use in a gigabit-capable passive optical network according to an embodiment of the present invention. As shown in FIG. 1, the method comprises the steps described hereunder.

Step S1 involves providing a printed circuit board having a first periphery and an opposing second periphery.

Step S2 involves laying out an analog circuit module at the first periphery of the printed circuit board so as for a plurality of analog signals to be transmitted between the printed circuit board and an external circuit. Due to the layout of the analog circuit module, the printed circuit board can receive a plurality of analog signals from an external circuit through the analog circuit module, or a plurality of analog signals intrinsically generated by the printed circuit board are transmitted to an external circuit of the printed circuit board. The analog signals are suitable for multi-port transmission, that is, multi-channel upstream or downstream transmission of communication data between a client and the gigabit-capable passive optical network. Step S2 further comprises laying out at least one of a plurality of external line input units, a plurality of line driver units, and a plurality of analog front end (AFE) units.

Step S3 involves laying out an analog-to-digital conversion module on the printed circuit board in a manner that the analog-to-digital conversion module is disposed in vicinity of the analog circuit module for converting the analog signals into a plurality of digital signals and vice versa, respectively. The analog-to-digital conversion module converts the analog signals thus received into the digital signals, so as to provide the digital signals for the other modules of the printed circuit board. Also, the analog-to-digital conversion module converts the digital signals generated by the other modules of the printed circuit board into the analog signals.

Step S4 involves laying out a signal processing module on the printed circuit board in a manner that the signal processing module is disposed in vicinity of the analog-to-digital conversion module so as to process the digital signals. Step S4 further comprises laying out at least one of a digital signal processing (DSP) unit, a microprocessing unit, and a memory unit.

Step S5 involves laying out an optoelectronic transmitting and receiving module at the first periphery of the printed circuit board for performing optoelectronic modulation transfer on the digital signals and, upon completion of the optoelectronic modulation transfer, transmitting and receiving the digital signals in optical or electrical form. The optoelectronic transmitting and receiving module is disposed in vicinity of the analog circuit module. The optoelectronic transmitting and receiving module is for converting the digital signals carrying electrical signals into the digital signals carrying optical signals by means of an electro-optic modulator during the optoelectronic modulation transfer, and then transmitting the digital signals carrying optical signals to an external circuit of the printed circuit board. Also the optoelectronic transmitting and receiving module is for converting the digital signals carrying optical signals (received from an external circuit) into the digital signals carrying electrical signals by means of an OE modulator during the optoelectronic modulation transfer. Step S5 further comprises laying out a passive optical network unit and a radio frequency connecting unit. For example, the passive optical network unit comprises an optical emitter and an optical receiver, and the radio frequency connecting unit is Bayonet Neill-Concelman (BNC).

Step S6 involves laying out a power module at the second periphery of the printed circuit board for supplying power to the modules on the printed circuit board. For example, the power module provides a DC-to-DC voltage circuit which is switchable and thus capable of providing selectively a plurality of DC voltages as needed.

Figure 2:
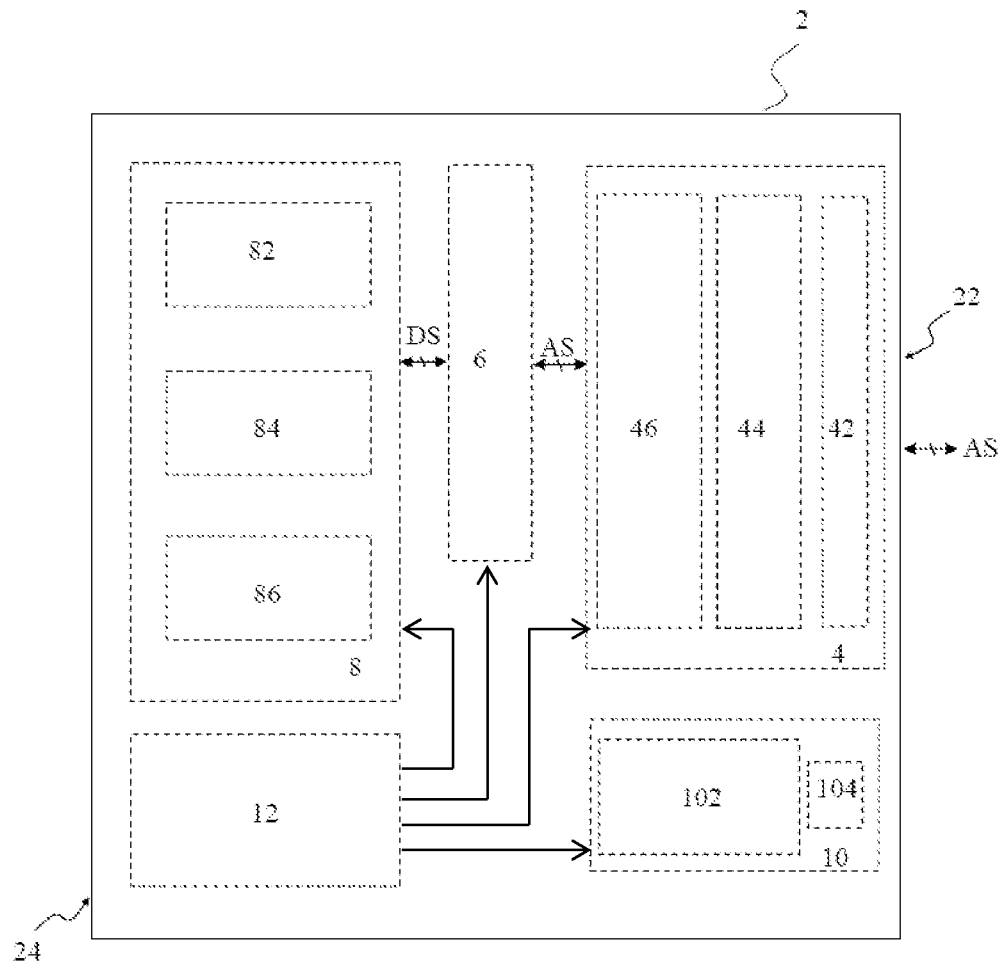
FIG. 2 is a schematic view of a printed circuit board for use in a gigabit-capable passive optical network according to an embodiment of the present invention.

Referring to FIG. 2, there is shown a schematic view of a printed circuit board for use in a gigabit-capable passive optical network according to an embodiment of the present invention. As shown in FIG. 2, a printed circuit board 2 has a first periphery 22 and an opposing second periphery 24. The printed circuit board 2 comprises an analog circuit module 4, an analog-to-digital conversion module 6, a signal processing module 8, an optoelectronic transmitting and receiving module 10, and a power module 12.

The analog circuit module 4 is disposed at the first periphery 22 of the printed circuit board. The analog circuit module 4 enables a plurality of analog signals AS to be transmitted between the printed circuit board 2 and an external circuit. The analog circuit module 4 comprises at least one of a plurality of external line input units 42, a plurality of line driver units 44, and a plurality of analog front end (AFE) units 46. A plurality of terminals are disposed in the external line input units 42 and configured to connect the external line input units 42 and an external line. The line driver units 44 are each an electronic chip having 4 ports, 8 ports, or 16 ports.

The analog-to-digital conversion module 6 is disposed near and connected to the analog circuit module 4. The analog-to-digital conversion module 6 converts the analog signals AS into a plurality of digital signals DS and vice versa, respectively.

The signal processing module 8 is disposed near and connected to the analog-to-digital conversion module 6. The signal processing module 8 is for processing the digital signals DS. The signal processing module 8 comprises at least one of a digital signal processing (DSP) unit 82, a microprocessing unit 84, and a memory unit 86.

The optoelectronic transmitting and receiving module 10 is connected to the signal processing module 8 and disposed at the first periphery 22. The optoelectronic transmitting and receiving module 10 performs optoelectronic modulation transfer on the digital signals DS and, upon completion of the optoelectronic modulation transfer, transmits and receives the digital signals DS in optical or electrical form. The optoelectronic transmitting and receiving module 10 comprises a passive optical network unit 102 and a radio frequency connecting unit 104. For example, the passive optical network unit 102 comprises an optical emitter and an optical receiver, and the radio frequency connecting unit 104 is Bayonet Neill-Concelman connector (BNC).

The passive optical network unit 102 and the radio frequency connecting unit 104 are closely connected with each other. The radio frequency connecting unit 104 is shielded from electromagnetic interference (EMI) that originates in the power module 12.

The power module 12 is connected to the analog circuit module 4, the analog-to-digital conversion module 6, the signal processing module 8, and the optoelectronic transmitting and receiving module 10. The power module 12 is disposed at the second periphery 24 and configured to supply power to the analog circuit module 4, the analog-to-digital conversion module 6, the signal processing module 8, and the optoelectronic transmitting and receiving module 10. The power module 12 can be laid out in the form of a DC-DC circuit layout.

The present invention provides a method for laying out a printed circuit board for use in a gigabit-capable passive optical network. Compared to the prior art, the present invention not only implements a multi-port chip dedicated to communication and transmission, using a simpler circuit layout, but protects a radio frequency connecting unit disposed on the printed circuit board against electromagnetic interference (EMI) from the power module and thus provides a high-quality output signal. The present invention further provides a printed circuit board for use with the method.

The foregoing embodiments are provided to illustrate and disclose the technical features of the present invention, and are not intended to be restrictive of the scope of the present invention. Hence, all equivalent modifications and replacements made to the foregoing embodiments without departing from the spirit embodied in the disclosure of the present invention should fall within the scope of the present invention as set forth in the appended claims. Accordingly, the protection for the present invention should be defined by the appended claims.

What is claimed is:

1. A method for laying out a printed circuit board for use in a gigabit-capable passive optical network, comprising the steps of:
   providing a printed circuit board having a first periphery and an opposing second periphery;
   laying out an analog circuit module at the first periphery of the printed circuit board so as for a plurality of analog signals to be transmitted between the printed circuit board and an external circuit;
   laying out an analog-to-digital conversion module on the printed circuit board in a manner that the analog-to-digital conversion module is disposed in vicinity of the analog circuit module for converting the analog signals into a plurality of digital signals and vice versa, respectively;
   laying out a signal processing module on the printed circuit board in a manner that the signal processing module is disposed in vicinity of the analog-to-digital conversion module so as to process the digital signals;
   laying out an optoelectronic transmitting and receiving module at the first periphery of the printed circuit board for performing optoelectronic modulation transfer on the digital signals and, upon completion of the optoelectronic modulation transfer, transmitting and receiving the digital signals in optical or electrical form; and
   laying out a power module at the second periphery of the printed circuit board for supplying power to the modules on the printed circuit board.

2. The method of claim 1, wherein the step of laying out the analog circuit module further comprises at least one of a plurality of external line input units, a plurality of line driver units, and a plurality of analog front end (AFE) units.

3. The method of claim 1, wherein the step of laying out the signal processing module further comprises at least one of a digital signal processing (DSP) unit, a microprocessing unit, and a memory unit.

4. The method of claim 1, wherein the step of laying out the optoelectronic transmitting and receiving module further comprises laying out a passive optical network unit and a radio frequency connecting unit.

5. A printed circuit board for use in a gigabit-capable passive optical network, wherein the printed circuit board having a first periphery and an opposing second periphery, the printed circuit board comprising:
   an analog circuit module disposed at the first periphery so as for a plurality of analog signals to be transmitted between the printed circuit board and an external circuit;
   an analog-to-digital conversion module disposed near and connected to the analog circuit module for converting the analog signals into a plurality of digital signal and vice versa, respectively;
   a signal processing module disposed near and connected to the analog-to-digital conversion module for processing the digital signals;
   an optoelectronic transmitting and receiving module connected to the signal processing module and disposed at the first periphery; and
   a power module connected to the analog circuit module, the analog-to-digital conversion module, the signal processing module, and the optoelectronic transmitting and receiving module and disposed at the second periphery.

6. The printed circuit board of claim 5, wherein the optoelectronic transmitting and receiving module comprises a passive optical network unit and a radio frequency connecting unit.

7. The printed circuit board of claim 6, wherein the passive optical network unit and the radio frequency connecting unit are closely connected with each other, such that the radio frequency connecting unit is shielded from electromagnetic interference (EMI) that originates in the power module.

8. The printed circuit board of claim 5, wherein the analog circuit module comprises at least one of a plurality of external line input units, a plurality of line driver units, and a plurality of analog front end (AFE) units.

9. The printed circuit board of claim 8, wherein each of the line driver units is an electronic chip having 4 ports, 8 ports, or 16 ports.

10. The printed circuit board of claim 5, wherein the signal processing module comprises at least one of a digital signal processing (DSP) unit, a microprocessing unit, and a memory unit.

* * * * *